US008363201B2

United States Patent
O'Rourke et al.

(10) Patent No.: US 8,363,201 B2
(45) Date of Patent: Jan. 29, 2013

(54) FLEXIBLE TRANSPARENT ELECTRODES VIA NANOWIRES AND SACRIFICIAL CONDUCTIVE LAYER

(75) Inventors: Shawn O'Rourke, Tempe, AZ (US); Pete Smith, Long Valley, NJ (US)

(73) Assignee: Arizona Board of Regents, a body corporate of the state of Arizona acting for and on behalf of Arizona State University, Scottsdale, AZ (US)

( * ) Notice: Subject to any disclaimer, the term of this patent is extended or adjusted under 35 U.S.C. 154(b) by 777 days.

(21) Appl. No.: 12/522,862

(22) PCT Filed: Jan. 18, 2008

(86) PCT No.: PCT/US2008/051424
§ 371 (c)(1),
(2), (4) Date: Oct. 8, 2009

(87) PCT Pub. No.: WO2008/089401
PCT Pub. Date: Jul. 24, 2008

(65) Prior Publication Data
US 2010/0028633 A1    Feb. 4, 2010

Related U.S. Application Data

(60) Provisional application No. 60/885,503, filed on Jan. 18, 2007.

(51) Int. Cl.
*G02F 1/1333* (2006.01)
(52) U.S. Cl. ....................................................... 349/158
(58) Field of Classification Search .................. None
See application file for complete search history.

(56) References Cited

U.S. PATENT DOCUMENTS

| 6,902,658 | B2 | 6/2005 | Talin et al. |
| 6,969,690 | B2 | 11/2005 | Zhou et al. |
| 7,697,081 | B2 * | 4/2010 | Yang et al. ............... 349/33 |
| 2004/0140755 | A1 | 7/2004 | Lee et al. |
| 2004/0241896 | A1 | 12/2004 | Zhou et al. |
| 2005/0184641 | A1 * | 8/2005 | Armitage et al. ........ 313/495 |
| 2006/0203181 | A1 * | 9/2006 | Han et al. ................ 349/187 |
| 2008/0174711 | A1 * | 7/2008 | Jung et al. .............. 349/46 |

FOREIGN PATENT DOCUMENTS

WO    2004/042108 A2    5/2004

OTHER PUBLICATIONS

Oh, et al. (2004) "Liquid-phase fabrication of patterned carbon nanotube field emission cathodes," Applied Physics Letters, 84(19):3738-3740.

* cited by examiner

*Primary Examiner* — Lucy Chien
(74) *Attorney, Agent, or Firm* — McDonnell Boehnen Hulbert & Berghoff LLP

(57) ABSTRACT

A flexible, transparent electrode structure and a method of fabrication thereof are provided comprising a transparent electrode which may maintain electrical connectivity across a surface of a flexible substrate so that the substrate may flex without affecting the integrity of an electrical contact. The transparent electrode includes conductive nanowires that are coupled to the substrate through a conducting oxide layer. The conducting oxide layer effectively provides a template onto which the nanowires are deposited and serves to anchor the nanowires to the substrate surface.

23 Claims, 2 Drawing Sheets

FLEXIBLE TRANSPARENT ELECTRODES VIA NANOWIRES AND SACRIFICIAL CONDUCTIVE LAYER

CROSS-REFERENCE TO RELATED APPLICATIONS

This application claims priority, under 35 U.S.C. §119(e), of the filing date of U.S. Provisional Application Ser. No. 60/885,503, filed Jan. 18, 2007 which is incorporated by reference in its entirety.

GOVERNMENT RIGHTS

The U.S. Government through the Department of the Army provided financial assistance for this project under Contract No. W911NF-04-2-0005. Therefore, the United States Government has certain rights to this invention.

FIELD OF THE INVENTION

The present invention relates generally to patterned flexible substrates comprising conductive nanowires and methods for their production.

BACKGROUND

Today's flat panel displays use arrays or matrices of electro-optic devices to reflect or generate light (e.g., organic light emitting diodes; electro-wetting light valves; cholesteric, twisted nematic, or super twisted nematic liquid crystals cells; and electrophoretic or micro-electromechanical devices). Typically, in a rigid, non-flexible display an electro-optic device is housed within glass or other suitable substrate. Electro-optic devices are arranged within a substrate so that they may each receive an applied voltage from a pair of electrodes. The applied voltage adjusts the wavelength and/or intensity of a device's output light. In general, a substrate will have a densely packed grid of electrodes on its front and back sides.

To ensure that light efficiently propagates through the substrate and is not significantly absorbed by an electrode, flat panel displays use "transparent" electrodes. A common transparent electrode material is indium tin oxide (ITO).

Unfortunately, ITO and other conductive oxides suffer from the problem of brittle fracture. Consequently, these oxides are ineffective as electrodes in flexible displays. For example, when a flexible display is flexed, an ITO based electrode may fracture, which may deleteriously affect the electrical coupling with an electro-optic device. Therefore, there is a need to provide flexible transparent conductors for flexible displays.

SUMMARY

In a first aspect, the invention provides a flexible assembly comprising a flexible substrate and a patterned layer formed over the flexible substrate, wherein the patterned layer comprises a conducting oxide layer and a second conductive layer comprising a plurality of conductive nanowires formed directly on the conducting oxide layer, wherein the patterned layer has a line spacing of less than about 25 µm.

In a second aspect, the invention provides a flexible display, comprising the flexible assembly of the first aspect of the invention.

In a third aspect, the invention provides a method of fabricating a patterned flexible substrate comprising providing a flexible substrate having a patterned layer comprising a conducting oxide layer formed over at least one surface of the substrate; forming a second conductive layer comprising conductive nanowires directly on the conducting oxide layer wherein the patterned layer has a line spacing of less than about 25 µm.

In a fourth aspect, the invention provides a method of fabricating a patterned flexible substrate comprising: providing a flexible substrate having a conducting layer formed over at least one surface of the substrate, wherein the conducting layer comprises a conducting oxide layer formed over the flexible substrate and a second conductive layer comprising conductive nanowires formed directly on the conducting oxide layer, forming a photoresist layer over the second conductive layer; patterning and developing the photoresist layer to provide masked and unmasked portions of the conducting layer; and etching the unmasked portions of the conducting layer to yield a patterned conducting layer comprising the conducting oxide layer and the second conductive layer and having a line spacing of less than about 25 µm.

DETAILED DESCRIPTION

Figure 1A:
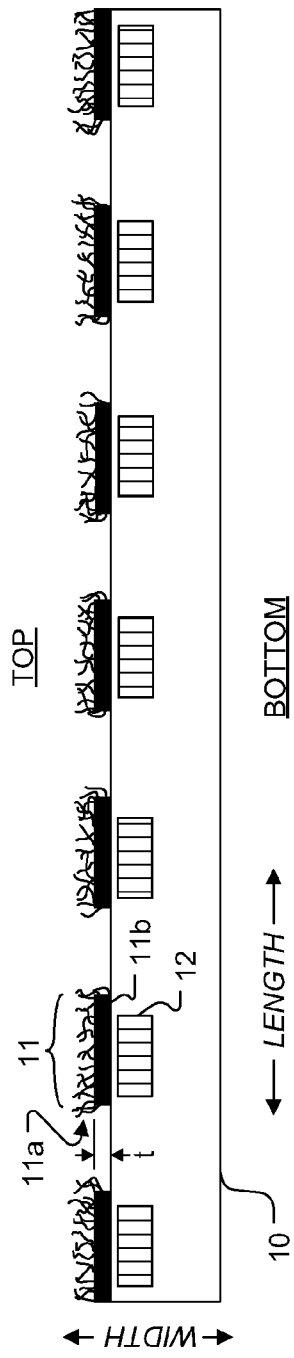
FIG. 1A is a cross-section of a transparent electrode structure, according to an example.

The term "flexible substrate" as used herein means a substrate capable of being rolled into a shape having a radius of curvature ranging from about ⅛" to about 6"; more preferably, the flexible substrate has a radius of curvature ranging from about ¼" to about 6", or ¼" to about 4", or about ¼" to about 2", or about ¼" to about 1", or about ¼" to about ½".

The term "binding salts" as used herein means a salt which facilitates the adhesion of conductive nanowires, as defined herein, to a surface comprising an inorganic oxide. In particular, the binding salts facilitate the adhesion of conductive nanowires, as defined herein, to the surface of a transparent conducting oxide, as defined herein. Examples of binding salts include, but are not limited to Al salts, Y salts, Na salts, Mg salts, and La salts, for example, NaOH, $Y(NO_3)_3$, $AlCl_3$, $MgCl_2$, $MgCO_3$, $Mg(NO_3)_2$, $Mg(OH)_2$, MgO, $LaCl_3$, $La(NO_3)_3$, $La_2(CO_3)_3$, and mixtures thereof.

The term "conducting oxide" as used herein refers to materials which have an electrical resistance of less than about 500 Ω/square. Preferably, conducting oxides have an electrical resistance which is less than about 250, 100, 50, or 25 Ω/square. Examples of transparent conducting oxides include, but are not limited to indium oxide, cadmium oxide, zinc oxide, tin oxide, gallium oxide, doped indium oxide, doped zinc oxide, copper aluminum oxide, copper gallium oxide, antimony tin oxide, cadmium stannate, zinc stannate, and mixtures thereof.

The term "transparent" as used herein refers to a material which transmit an average of greater than about 80% of incident visible light across the visible light spectrum. Preferably, transparent means that a material transmits greater than about 85%, 90%, or 95% of incident visible light across the visible light spectrum. Materials which do not transmit at least an average of greater than about 80% of incident visible light across the visible light spectrum are referred to herein as "non-transparent."

The term "doped indium oxide" as used herein refers to materials comprising indium oxide ($In_2O_3$) where a portion of the indium atoms have been replaced by one or more elements selected from the group consisting of Zn, Sn, Mo, Ti, Ta, Ga, Sb, Pb, Ge, Al, and Cd. For example, doped indium oxide includes, but is not limited to, indium tin oxide, indium gallium zinc oxide, and indium zinc oxide. Indium tin oxide may comprise, for example, 90 wt % $In_2O_3$ and 10 wt. % $SnO_2$.

The term "doped zinc oxide" as used herein refers to materials comprising zinc oxide (ZnO) where a portion of the zinc atoms have been replaced by one or more elements selected from the group consisting of In, Sn, Mo, Ti, Ta, Ga, Sb, Pb, Ge, Al, and Cd. For example, doped zinc oxide includes, but is not limited to, aluminum zinc oxide, titanium zinc oxide, and zinc tin oxide.

The term "conductive nanowires" as used herein, refer to single-walled nanotubes (SWNTs), multi-walled nanotubes (MWNTs), or metallic nanowires having a diameter ranging from about 0.5 to about 100 nm and a length ranging from about 500 nm to about 10 μm. Structurally, SWNTs are typically formed of a single graphene sheet rolled into a seamless tube with a diameter on the order of about 0.5 nm to about 5 nm with lengths ranging from, for example, 1-10 μm. Multi-walled nanotubes (MWNT) consist of multiple graphene layers rolled in on themselves to form a tube shape, and can have outer diameters ranging from about 1.0 nm to 20 nm with lengths ranging from, for example, 1-10 μm. Depending on diameter and helicity, SWNTs and MWNTs can behave as one-dimensional metals ("metallic nanotubes") or semiconductors ("semiconducting nanotubes") and are currently available as a mixture of metallic and semiconducting nanotubes. Metallic nanowires include, but are not limited to, Ag, Au, Pt, and Ni nanowires having a cross-sectional area ranging from about 1 to about 500 $nm^2$ and lengths ranging from, for example, 0.5-10 μm.

The term "patterned layer" as used herein refers to a discontinuous layer having a plurality of surface features within the layer plane which have an average feature size and line spacing. Surface features include any shape which may be formed according to lithographic methods known to those skilled in the art. Each surface feature may be of the same or different sizes and may be in a predetermined arrangement, such as a rectangular array or a circular array, among others; features further include lines, circles, and the like. Each feature may comprise one or more layers within the feature which may comprise the same or different materials. "Line spacing" as used herein refers to the average distance between any two surface features which are directly next to one another. "Feature size" refers to the minimum cross-sectional dimension of any particular surface feature; for example, a line having a width of 25 μm and a length of 100 μm would have a feature size of 25 μm. The feature sizes herein may range from about 25 nm to about 25 μm, about 50 nm to about 25 um, about 100 nm to about 25 μm, about 250 nm to about 25 μm, about 500 nm to about 25 μm, about 1 μm to about 25 μm, or about 1 μm to about 10 μm.

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

It should be further understood that when a layer is referred to as being "directly on" another layer or substrate, the two layers are in direct contact with one another with no intervening layer. It should also be understood that when a layer is referred to as being "directly on" another layer or substrate, it may cover the entire layer or substrate, or a portion of the layer or substrate.

FIG. 1A shows an exemplary embodiment of the present invention, illustrating a flexible assembly comprising a substrate 10; a patterned conductive layer comprising a plurality of surface features 11; and, an electro-optic device 12 that may be, in certain embodiments, housed within the substrate 10. The electro-optic device 12 may be, for example, an organic light emitting diode; an electro-wetting light valve; a cholesteric or twisted nematic liquid crystal cell, or super twisted nematic liquid crystal cell; an electrophoretic pixel; or a micro-electromechanical device. However, other devices are possible. For example, in lieu of the device 12, an electrically-responsive fluid may be located within a cavity of the substrate 10.

Each of the plurality of surface features 11 of the patterned conductive layer comprises a conducting oxide layer 11b and a second conductive layer 11a comprising conductive nanowires formed directly on the conducting oxide layer. In certain embodiments, the plurality of surface features may operate as electrodes, however, they may also form part of one or more larger structures formed on an flexible substrate, for example, a field effect transistor or a organic (or inorganic) light emitting diode.

The substrate 10 is a flexible substrate, which may comprise materials such as a flexible polymer (e.g., polyethylene naphthalate, polyimide, polyethersulfone, polyurethane, polycarbonate, etc.). It should be understood, however, that the substrate 10 may comprise a variety of other tailored materials including but not limited to, thin glass (i.e., about 50 to 250 microns thick), poly(ethylene terephthalate) (PET), flexible stainless steel and other metal alloys, and mica sheets. In general, the flexible substrate may comprise additional conductive layers between a flexible polymer layer and the patterned conductive layer, provided that at least one dielectric material (e.g., $SiO_2$, SiLK™) is provided between the patterned conductive layer and any intervening conductive layers.

In addition, to maintain electrical and physical isolation between neighboring surface features the patterned conductive layer may be encapsulated in one or more dielectric layers (not shown). Generally speaking, the patterned conductive layer may be formed so that an electric field, voltage, or current may be supplied to the plurality of active devices 12 through the surface features 11 (i.e., electrodes). Also, each of the plurality of surface features 11 may entirely overlap a device 12 as is shown in FIG. 1A (i.e., the length of the surface feature 11 is greater than the length of the device 12). In an alternative example, the surface features 11 may be tailored so that it only overlaps a portion of the device 12. In general, the patterned conductive layer is well suited for flexible display applications.

The flexible assembly may be transparent or non-transparent as necessary for the device to be prepared. In certain embodiments, the flexible substrate, conducting oxide layer, and second conductive layers, and any combination thereof, are transparent. For example, in some embodiments, the flexible assembly may be transparent and does not block light that is output from the plurality of devices 12. In other embodiments, the flexible assembly may be non-transparent, for example, when utilized for addressing a light emitting element, such as a light emitting diode (inorganic or organic LED). Alternatively, the flexible assembly may, itself as a transparent or non-transparent assembly, emit light for a display applications, such as field emission displays (FEDs).

The nanowires 11a may be bound to the conducting oxide layer 11b by using a binding salt (e.g., $Mg(NO_3)_2$ or $La(NO_3)_3$). The binding salt is provided in a medium (e.g., an aqueous medium) such as dissolved in a processing suspension. Without being bound by any one particular theory of operation, a binding salt, such as $Mg(NO_3)_2$ or $La(NO_3)_3$, may form a Mg or La hydroxide complex at the surface which facilitates binding of the nanowires to the surface of the conducting oxide layer.

Alternatively, crosslinkers such as melamine-formaldehyde, phenol-formaldehyde, urea-formaldehyde, and acrylamide-formaldehyde crosslinkers may be employed to form a polymer cross-linked system which may be deposited onto the conducting oxide layer.

In certain embodiments, and in contrast to an opaque conductive material, the nanowires 11a can be transparent because light can propagate through gaps in the nanowire framework. In general, the nanowires 11a can be also largely transparent to light because the thickness of each nanowire may be less than the wavelength of light. In addition, nanowires may have a large length/diameter aspect ratio, which can provide excellent conductivity. It should be understood that any nanowire suitable for use with the present invention can be used, including but not limited to metallic (e.g., Ni, Pt, Au, Ag) nanowires. Because of their ballistic transport effects as well as their flexibility and neutral coloring, the nanowires 11a preferably comprise single walled or multi-walled carbon nanotubes.

In the present flexible assemblies, the nanowires 11a establish the conductive properties of the surface features (e.g., electrodes) 11. Although the conducting oxide layer 11b is conductive, its primary purpose is to promote attachment of the nanowires 11a to the substrate 10. Generally speaking, the conducting oxide layer 11b only needs to be conductive so that the binder salt attaches thereto, which, in the example of FIG. 1A, would be above the device 12. In general, the physical properties of the conducting oxide layer 11b, such as resistivity or thickness "t", may be negligible. For example, the conducting oxide layer 11b may be 500 Å or less in thickness. In other examples, the conducting oxide layer 11b may a thickness ranging from about 50 to about 500 Å, or about 50 to about 400 Å, or about 50 to about 300 Å, or about 50 to about 200 Å, or about 50 to about 100 Å. The conducting oxide layer 11b may be made sufficiently thin (i.e., by decreasing t) to minimize any distances between the nanowires 11a and the top surface of the substrate 10.

Figure 1B:
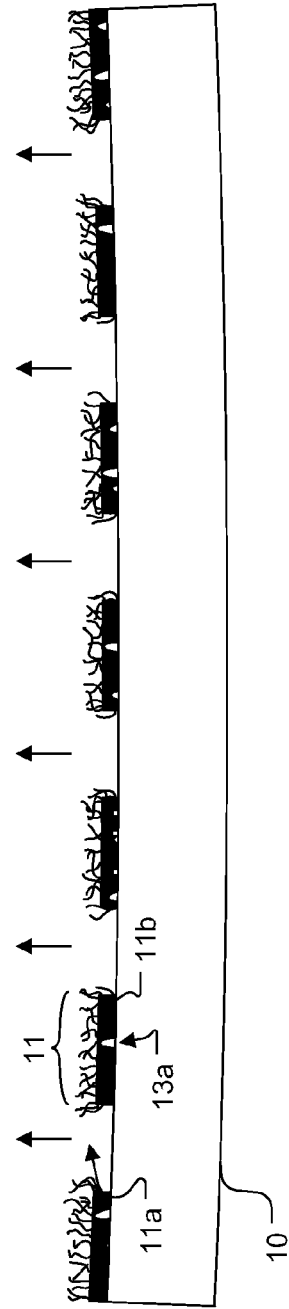
FIGS. 1B-C are cross-sections of the electrode structure of FIG. 1A being flexed and encountering fractures in an ITO layer, according to an example.
Figure 1C:
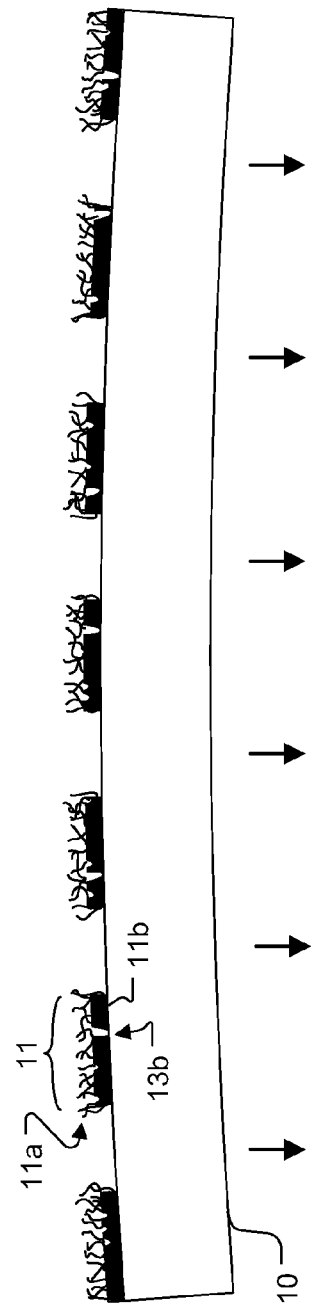

Because these physical properties of the conducting oxide layer 11b are negligible, the conducting oxide layer 11b may fracture (as a consequence of flexing the substrate 10) without significantly effecting the flexible assembly electrical contact with the top surface of the substrate 10 (or electro-optic devices located within the substrate 10). FIG. 1B shows the substrate 10 flexing upwards (with a slight radius of curvature) and FIG. 1C shows the substrate 10 flexing downwards (with a larger radius of curvature). In FIGS. 1B and 1C, the conducting oxide layer 11b comprises respective fractures 13a and 13b, which occur as a consequence of flexing the substrate. However, because the nanowires may have a high aspect ratio and may form a complex three-dimensional matrix, they have the ability to "bridge" fractures or cracks in the underlying brittle material. If the conducting oxide layer fractures, the network of nanowires will remain intact and maintain conductivity because there are multiple points of intersection within the network. The nanowires also ensure adequate conductivity because they each have an inherent conductivity and low contact resistivity.

Therefore, the conducting oxide layer 11b is a conductive layer that promotes binding of the nanowires to a substrate, but is free to fracture or crack once the nanowires have been bonded to the surface. Accordingly, the conducting oxide layer 11b may comprise ITO, or any other conductive oxide material (e.g., zinc oxide, antimony tin oxide, cadmium stannates, and zinc stannates).

The conducting oxide layer 11b may be patterned (e.g., via a photo-resist mask, shadow mask or direct print) and etched if desired (e.g., via a wet or dry chemical etch) to provide a patterned layer comprising the conducting oxide layer. Patterning the conducting oxide layer allows multiple flexible surface features to be formed on the substrate. It should be understood that in a given mask pattern, any number and shape of desired flexible assembly may be patterned.

Figure 2:
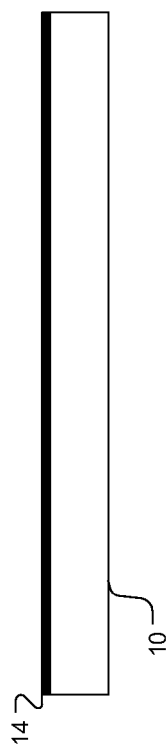
FIG. 2 is a cross section of a substrate having an unpatterned conducting oxide layer, according to an example.

In an additional embodiment, the conducting oxide layer may also be used to pattern the nanowires 11a. For example, in FIG. 2 the substrate 10 is shown with an unpatterned conducting oxide layer 14 deposited on a top surface of the substrate 10 (e.g., via reactive sputtering). As described above, the conducting oxide layer 14 may comprise an ITO film or any other suitable conducting oxide. In certain embodiments, the conductive oxide layer may be transparent.

Next, the conducting oxide layer 14 may be etched to create a patterned conducting oxide layer on the surface of the substrate 10. This may be carried out using conventional lithography techniques. For example, a photoresist mask in conjunction with wet and/or dry chemical etching may be used to transfer a pattern into the conducting oxide layer 14, creating individual islands in the conducting oxide layer 14. If the conducting oxide layer 14 comprises ITO, it may be etched in a wet bath using a combination of acids (typically HCl and $HNO_3$) or dry etched in a plasma of $HCl/CH_4$.

Figure 3:
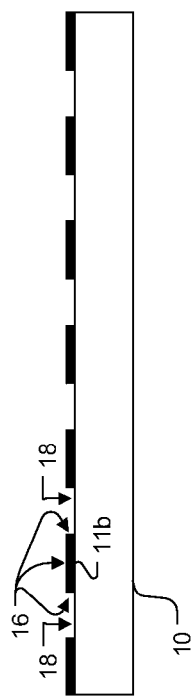
FIG. 3 is a cross section of the substrate of FIG. 2 after the conducting oxide layer is patterned, according to an example.

FIG. 3 shows that the conducting oxide layer 14 has been etched, which establishes the conducting oxide layer's 11b pattern. A surface area 16 of the conducting oxide layer 11b will then attract the nanowires 11a and the ions that form the binding matrix, which will cause the nanowires 11a to bind to the substrate 10. Essentially, the surface area 16 establishes the pattern in the nanowires 11a and overcomes problems that are inherent to patterning nanowires. Generally speaking, nanowires are difficult to pattern because they are not readily processed in the subtractive manner employed with ITO (i.e., the process of resist application, exposure via photolithography, and etch). However, because the nanowires 11a will preferentially bind to a conducting surface, such as the conducting oxide layer 11b, with respect to a non-conductive surface, for example, a bare surface 18, the inherent patterning problem with nanowires is eliminated.

Figure 4:
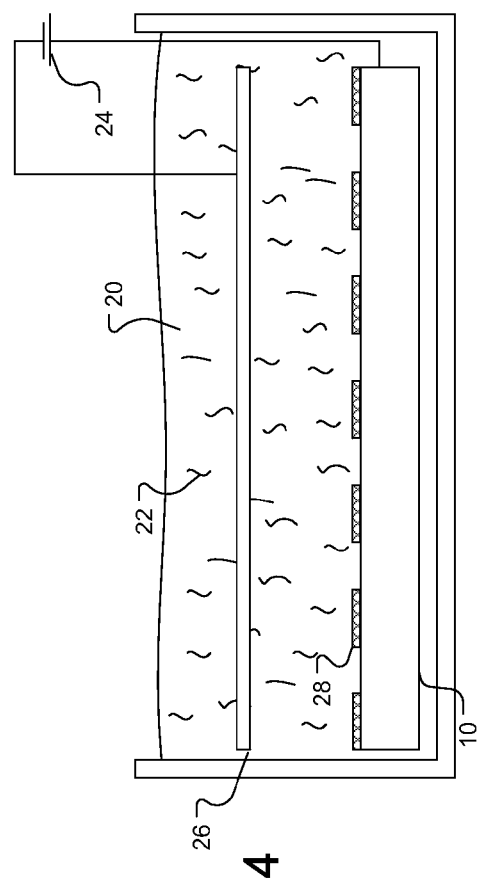
FIG. 4 is a cross section of the substrate of FIG. 3 undergoing nanowire deposition, according to an example.

In one embodiment, binding nanowires to the surface 16 of the conducting oxide layer 11b comprises immersing the substrate 10 in a solution that comprises dissolved binding salts and nanowires. Using electrophoresis, nanowires may be bonded to the conducting oxide layer 11b. FIG. 4 shows the substrate 10 undergoing electrophoresis in a solution 20 that comprises dissolved binding salts and nanowires 22. A voltage source 24 is used to apply a potential (10V to 120V) across the conducting oxide layer 11b and a counter electrode 26. The potential causes ions (i.e., from the dissolved binding salts) to migrate and form a binder layer 28 on the substrate 10. The potential also causes the nanowires 22 to bond, via the ions, to the conducting oxide layer 11b.

In another embodiment, binding nanowires to the surface 16 of the conducting oxide layer 11b comprises acoustophoresis bonding techniques to bond the nanowires to the substrate 10. For example, large energy sound waves may be provided to a medium comprising the conductive nanowires and an immersed flexible substrate comprising a patterned conducting oxide layer to drive the nanowires to the conducting oxide layer. Also, the above described techniques may be used to create surface features that are located on both the top and bottom of a flexible substrate.

Alternatively, it is also contemplated that nanowires may be first bonded to the unpatterned conducting oxide layer 11b (see below) prior to the conducting layer being patterned and etched. In such embodiments, a flexible substrate may be provided and subsequently a conducting oxide layer formed over the flexible substrate (supra). Next, a second conductive layer comprising the conductive nanowires may be formed directly on the conducting oxide layer, The second conductive layer may be formed according to methods known to those skilled in the art. For example, the second conductive layer may formed directly on the conducting oxide layer by electrophoretic deposition, spray-coating, dip-coating, ink-jet printing, or solution casting of a medium comprising the conductive nanowires. In a preferred embodiment, the nanowires are deposited electrophoretically, as described previously. Thereby, a flexible substrate is provided having a conductive layer formed over at least one surface of the substrate, wherein the conductive layer comprises a conducting oxide layer formed over the flexible substrate and a second conductive layer comprising conductive nanowires formed directly on the conducting oxide layer.

A photoresist layer (e.g., a positive or negative photoresist) may be formed over the second conductive layer according to method known to those skilled in the art. For example, the photoresist layer may be formed directly on the second conductive layer by spin-coating, spray-coating, dip-coating, ink-jet printing, or solution casting of a medium (e.g., aqueous or alcoholic solution) comprising the photoresist. The photoresist layer may be patterned (e.g., via a photo-resist mask, shadow mask or direct print) and developed, (e.g., via a wet or dry chemical washing) to provide masked and unmasked portions of the conducting layer. Finally, the unmasked portions of the conductive layer may be etched to yield a patterned conducting layer comprising the conducting oxide layer and the second conductive layer. In certain embodiments, the patterned conducting layer has a line spacing of less than about 25 μm.

Through the electrophoretic deposition of the nanowires as described herein, the instant methods provide selective deposition methods for forming more highly conductive nanowire layers with respect to deposition methods such as spin-coating or spray-coating. For example, in various embodiments of the present invention, the nanowires may be carbon nanotubes. Carbon nanotubes are often provided as a mixture of conducting nanotubes and semiconducting nanotubes, as are familiar to those skilled in the art. Under the present electrophoretic deposition method of carbon nanotubes from a medium (such as an aqueous or alcoholic solution), the conducting nanotubes display higher mobilities and deposition rates, such that an in situ separation of the conducting ('metallic') nanotubes is affected, thereby creating nanowire layers having greater conductivities with respect to non-selective deposition methods.

It should be understood that the illustrated embodiments and related description are examples only and should not be taken as limiting the scope of the present invention. For example, depending on the type of implementation, the relative thicknesses of the structural elements in any of the FIGS. 1-4 may vary.

The flexible assemblies described herein is not limited to being used exclusively as physically separate entities with respect to any overlying or underlying active component (e.g., liquid crystal cell, LED, etc.); it is also envisioned that the surface features of flexible assemblies described herein may form a constituent element of the active component formed thereon.

Further, the flexible assemblies described herein are not limited to being used exclusively in flexible display applications. It is contemplated that the described conductors could also be used in rigid display applications. For example, a rigid "touch" screen display may deform if it is pressed too hard. Such deformation may cause conventional transparent electrodes to fracture. However, nanowire-based transparent electrodes would overcome this limitation because fracturing of an ITO layer, for example, would not reduce the overall electrical integrity of the nanowire-based electrodes.

Furthermore, although the FIGS. 1-4 refer to a single transparent surface feature (i.e., electrode 11), it should be understood that multiple surface features may be created during the conducting oxide layer patterning. Since flexible displays generally comprise a matrix of photo-electric devices, a masking layer may, therefore, establish a corresponding matrix of surface features. In addition, the masking layer may be designed to provide a desired surface area of an electrode as well as a desired spacing between neighboring electrodes. For example, the patterned layers described herein may have a line spacing of less than about 25 μm. In further example the patterned layers described herein may have a line spacing of less than about 20 μm, 10 μm, 5 μm, 1 μm, or 500 nm. In yet other examples, the patterned layers described herein may have a line spacing ranging from about 500 nm to about 25 μm, or about 1 μm to about 25 μm or about 500 nm to about 10 μm. The surface features may independently have feature sizes ranging from about 25 nm to about 25 μm. For example, surface features may independently have feature sizes ranging from about 50 nm to about 25 μm, about 100 nm to about 25 μm, about 250 nm to about 25 μm, about 500 nm to about 25 μm, about 1 μm to about 25 μm, or about 1 μm to about 10 μm.

The claims should not be read as limited to the described order or elements unless stated to that effect. Therefore, all embodiments that come within the scope and spirit of the following claims and equivalents thereto are claimed as the invention.

EXAMPLES

Example 1

An example co-deposition process is described in Table 1.

TABLE 1

Load ITO anode (e.g., ITO coated PET) into fixture
Load Counter electrode into fixture.
Submerge electrodes into bath slurry.
Turn on power supply and set between 10 V to 120 V
Turn off power supply.
Attach negative terminal to ITO anode
Attach positive terminal to counter electrode
Turn on power supply to begin deposition
Turn off power supply to end deposition To prepare the solution 20 for electrophoresis, an exemplary solution may comprise the constituents of Table 2 and Table 3. Solution A is prepared and mixed until the crystals are dissolved; Solution B is ground; Mixture C, which comprises both Solutions A and B, is ultrasonicated; and finally, Solution D is used as a bath slurry (i.e., the solution 20) for the electrophoresis.

TABLE 2

| Solution A: | Solution B: |
| --- | --- |
| 4 g Lanthanum nitrate | Mix equal parts of IPA and glycerin. |
| 2 g Magnesium nitrate | (Typically: 100-200 ml) |
| 380 ml isopropanol (IPA) | Mix on a magnetic stirring plate. |
| 20 ml deionized (DI) water | (Approximately 30 minutes) |
| Mix Solution A on a magnetic stirrer until crystals are dissolved. (Approximately 1 hour) | Grind Solution B |

TABLE 3

| Mixture C: | Solution D: |
| --- | --- |
| 30 ml of Solution A | Mixture C |
| 20 ml of Solution B | 1920 ml IPA |
| 18 g Carbon Nanotubes | 30 ml additional "A" |
| 20 g to 40 g 3 mm glass beads | 49 ml DI water |
| Ultrasonicate Mixture C | Use as bath slurry in electrophoresis (i.e., solution 20) |

We claim:

1. A method of fabricating a patterned flexible substrate comprising:
   providing a flexible substrate having a patterned layer comprising a conducting oxide layer formed over at least one surface of the substrate;
   forming a second conductive layer comprising conductive nanowires directly on the conducting oxide layer wherein the patterned layer has a line spacing of less than about 25 µm, wherein forming the second conductive layer comprises one of the following:
   (a) providing a medium comprising binding salts and the conductive nanowires;
   immersing the flexible substrate in the medium; and
   applying a voltage across the conducting oxide layer and a counter electrode; or
   (b) providing a medium comprising the conductive nanowires;
   immersing the flexible substrate in the medium; and
   providing sonic waves or pressure waves to the medium and immersed substrate.

2. The method of claim 1, wherein forming the second conductive layer comprises
   providing a medium comprising binding salts and the conductive nanowires;
   immersing the flexible substrate in the medium; and
   applying a voltage across the conducting oxide layer and a counter electrode.

3. The method of claim 1, wherein forming the second conductive layer comprises
   providing a medium comprising the conductive nanowires;
   immersing the flexible substrate in the medium; and
   providing sonic waves or pressure waves to the medium and immersed substrate.

4. The method of claim 1, wherein the conducting oxide layer has a thickness less than about 500 Å.

5. The method of claim 4, wherein the conducting oxide layer has a thickness ranging from about 50 Å to about 200 Å.

6. The method of claim 1, wherein the conducting oxide layer comprises a transparent conducting oxide.

7. The method of claim 6, wherein the transparent conducting oxide comprises a doped indium oxide, a doped zinc oxide, antimony tin oxide, cadmium stannate, zinc stannate, or mixtures thereof.

8. The method of claim 7, wherein the transparent conducting oxide comprises indium tin oxide.

9. The method of claim 1, wherein the conductive nanowires comprise single-walled carbon nanotubes, multi-walled carbon nanotubes, or mixtures thereof.

10. The method of claim 1, wherein the flexible substrate comprises polyethylene naphthalate, polyimide, polyethersulfone, polyurethane, polycarbonate, or mixtures thereof.

11. The method of claim 1, where the flexible substrate is transparent.

12. A method of fabricating a patterned flexible substrate comprising:
    providing a flexible substrate having a conducting layer formed over at least one surface of the substrate, wherein the conducting layer comprises a conducting oxide layer formed over the flexible substrate and a second conductive layer comprising conductive nanowires formed directly on the conducting oxide layer,
    forming a photoresist layer over the second conductive layer;
    patterning and developing the photoresist layer to provide masked and unmasked portions of the conducting layer; and
    etching the unmasked portions of the conducting layer to yield a patterned conducting layer comprising the conducting oxide layer and the second conductive layer and having a line spacing of less than about 25 nm.

13. The method of claim 12, wherein the providing a flexible substrate having a conducting layer formed over at least one surface of the substrate comprises
    providing a flexible substrate;
    forming a conducting oxide layer over the flexible substrate; and
    forming a second conductive layer comprising conductive nanowires directly on the conducting oxide layer.

14. The method of claim 13, wherein the conducing oxide layer is formed by sputtering.

15. The method of claim 13, wherein the second conductive layer is formed by electrophoretic deposition, spray-coating, dip-coating, ink-jet printing, or solution casting of the conductive nanowires from a medium comprising the conductive nanowires onto the conducting oxide layer.

16. The method of claim 12, wherein the conducting oxide layer has a thickness less than about 500 Å.

17. The method of claim 16, wherein the conducting oxide layer has a thickness ranging from about 50 Å to about 200 Å.

18. The method of claim 12, wherein the conducting oxide layer comprises a transparent conducting oxide.

19. The method claim 18, wherein the transparent conducting oxide comprises a doped indium oxide, a doped zinc oxide, antimony tin oxide, cadmium stannate, zinc stannate, or mixtures thereof.

20. The method of claim 19, wherein the transparent conducting oxide comprises indium tin oxide.

21. The method of claim 12, wherein the conductive nanowires comprise single-walled carbon nanotubes, multi-walled carbon nanotubes, or mixtures thereof.

22. The method of claim 12, wherein the flexible substrate comprises polyethylene naphthalate, polyimide, polyethersulfone, polyurethane, polycarbonate, or mixtures thereof.

23. The method of claim 12, where the flexible substrate is transparent.

* * * * *